United States Patent [19]

Ahn

[11] Patent Number: 5,274,258
[45] Date of Patent: Dec. 28, 1993

[54] HIGH DENSITY SEMICONDUCTOR MEMORY DEVICE (MBC CELL)

[75] Inventor: Ji-hong Ahn, Seoul, Rep. of Korea

[73] Assignee: Samsung Electronics Co., Ltd., Suwon, Rep. of Korea

[21] Appl. No.: 715,913

[22] Filed: Jun. 14, 1991

[30] Foreign Application Priority Data

Jan. 30, 1991 [KR] Rep. of Korea .................. 91-1590

[51] Int. Cl.⁵ .................................... H01L 27/02
[52] U.S. Cl. .................................. 257/308; 257/309; 365/149
[58] Field of Search .............. 257/296, 300, 306, 307, 257/308, 309, 310; 365/149; 437/52, 60

[56] References Cited

U.S. PATENT DOCUMENTS

| | | | |
|---|---|---|---|
| 5,047,817 | 9/1991 | Wakamiya et al. | 357/23.6 |
| 5,061,650 | 10/1991 | Dennison et al. | 257/306 |
| 5,077,688 | 12/1991 | Kumanoya et al. | 365/149 |
| 5,102,820 | 4/1992 | Chiba | 257/306 |
| 5,140,389 | 8/1992 | Kimura et al. | 257/309 |
| 5,164,337 | 11/1992 | Ogawa et al. | 257/308 |

FOREIGN PATENT DOCUMENTS

| | | |
|---|---|---|
| 0294840 | 12/1988 | European Pat. Off. |
| 0295709 | 12/1988 | European Pat. Off. |
| 0318277 | 5/1989 | European Pat. Off. |
| 0404553 | 6/1990 | European Pat. Off. |
| 0443439 | 2/1991 | European Pat. Off. |
| 0415530 | 3/1991 | European Pat. Off. |
| 62-286270 | 12/1987 | Japan ........... 257/306 |
| 2242782 | 10/1991 | United Kingdom. |
| 2244597 | 12/1991 | United Kingdom. |
| 2250377 | 6/1992 | United Kingdom. |
| 2252447 | 8/1992 | United Kingdom. |

OTHER PUBLICATIONS

IBM Technical Disclosure Bulletin, "Stacked Capacitor Dram Cell with Vertical Fins (VF-STC)," vol. 33, No. 2, Jul. 1990.
Patetnt Abstracts of Japan, vol. 15, No. 308 (E-109) Aug. 1991, and JP-A-31 10 863 (NEC Corp.), May 10, 1991.
Patent Abstracts of Japan, vol. 14, No. 533 (E-1005) Nov. 22, 1990 and JP-A-22 26 761 (Hitachi Ltd.) Sep. 10, 1980.

*Primary Examiner*—William Mintel
*Assistant Examiner*—Minhloan Tran
*Attorney, Agent, or Firm*—Morgan & Finnegan

[57] ABSTRACT

A high-density semiconductor memory device and its manufacturing method are disclosed. The device has a plurality of memory cells, each consisting of one transistor and one capacitor on a substrate in a matrix form. The capacitor, in contact with the source region of the transistor, consists of a storage electrode having a hollow cylindrical electrode with a wall of predetermined thickness, and a column electrode surrounded by the cylindrical electrode. The capacitor further comprises a plurality of bars, a base plate electrode connecting the cylindrical and column electrodes to each other, a dielectric layer coating the whole surface of the storage electrode, and a plate electrode formed on top of the dielectric layer. According to this invention, a greater capacitance may be obtained while avoiding current leakage and the disparity of cell capacitance problems involved with a conventional stack-type capacitor having a ringed structure.

10 Claims, 14 Drawing Sheets

HIGH DENSITY SEMICONDUCTOR MEMORY DEVICE (MBC CELL)

BACKGROUND OF THE INVENTION

The present invention relates to a semiconductor memory device and manufacturing method thereof and, more particularly, to a high density semiconductor memory device and manufacturing method thereof having an improved storage electrode structure capacitor that increases the cell capacitance of a memory cell having a stack-type capacitor structure.

Depending upon the reduction of memory cell size, cell capacitance diminution may become a serious obstacle in the integration of DRAM (Dynamic Random Access Memory) chips. Increasing cell capacitance diminution deteriorates the read-out ability of a memory cell and increases the so-called soft errors while making low voltage element operations more difficult, which also results in excessive power consumption. Therefore, there is a need to overcome the problem of capacitance diminution in highly integrated semiconductor memory devices.

In 64 megabyte DRAMs that have a memory cell size of approximately 1.5 $\mu m^2$, if a standard two-dimensional stack-type memory cell is used, obtaining sufficient capacitance remains very difficult even when using a high dielectric constant substance such as $Ta_2O_5$. Three-dimensional stack-type capacitors have already been proposed to increase the capacitance of memory cells.

For example, the double stack structure, fin structure, cylindrical electrode structure, spread stack structure and box structure are all three-dimensional storage electrode structures that have been proposed to increase the cell capacitance of memory cells.

A three-dimensional stack-type cell capacitor structure, in which the cylindrical structure utilizes the outer surface and the inside surface of a hollow cylinder as an effective capacitive region, may be particularly adopted as a structure suitable for memory cells of the 64 megabyte generation and higher. Ring-structured stack-type capacitors, of the type common to a person skilled in the art, are currently proposed for such high capacity memory structures. The ring structure capacitors improve upon the rather simple cylindrical structure by adding a column inside the hollowed cylinder so that the effective capacitive area becomes the outer surface of the additional inner column as well as the inner and outer surfaces of the outer cylinder (refer to "A Stacked Capacitor Cell With Ring Structure", 1990, 22nd conference on SSDM, part II, pp. 833 to 836).

To better understand the known prior art in the memory structure field, cross-sectional views are shown in FIG. 1A through FIG. 1G, of the process sequence for forming cylindrical storage electrodes having an inner column electrode therein.

In FIGS. 1A and 1B, after sequentially piling an insulating layer 19 and a nitrification layer 22 on a semiconductor substrate 10 which has two transistors both having a source 14, gate electrode 18, and sharing a common drain 16 and a buried bit line 20 formed on the drain regions of the transistor, contact holes 24 are formed by selectively etching both the insulating layer and the nitrification layer deposited on the source region. Thereafter, a first multi-crystalline silicon layer 26 (see FIG. 1C) is deposited to a predetermined thickness on the nitrification layer 22, filling the contact holes 24.

An oxide layer pattern 28 is formed by patterning an oxide layer deposited on the silicon layer 26 so that a column can be formed inside of a cylinder. Continuing into FIG. 1D, after forming a column electrode 26a (not shown) by etching back the first polycrystalline silicon layer 26 to a predetermined depth using the oxide layer pattern 28 as a mask, an insulating layer 30a (not shown) having a different etching selection rate from that of the oxide layer pattern 28 is then deposited on the first multi-crystalline silicon layer. While most of insulating layer 30a is thereafter removed by anisotropic etching, a portion of insulating layer 30a is not removed at this time, forming a first spacer 30 on each sidewall of the oxide layer pattern 28 and column electrode 26a. Referring to FIG. 1E, after depositing a second polycrystalline silicon layer 32a (not shown) over the whole surface of the semiconductor substrate, on which the oxide layer pattern 28, the spacer 30 and the column electrode 26a are formed, a cylindrical electrode 32 is completed by forming a second spacer composed of the second polycrystalline silicon onto the sidewall of the first spacer 30, by performing anisotropic etching on both the first and second polycrystalline silicon layers. Thereafter, both the oxide layer pattern 28 and the spacer 30 are removed by wet etching (see FIG. 1F). Storage electrodes S1 and S2 having a column electrode 26b (shown in FIG. 1E) and a cylindrical electrode 32 are now complete. Finally, the formation of the ring-structured stack-type capacitor is completed by coating a dielectric layer 34 onto the whole surface of storage electrode and depositing a third polycrystalline 36 onto the entire resultant surface (see FIG. 1G).

Conventional high-density semiconductor memory devices which utilize the above-described column electrode inside a cylindrical electrode to increase a cell's capacitance by taking advantage of outer column electrode surfaces and inner and outer surfaces of the cylindrical electrode as an effective capacitor area, are being adopted as powerful models in the realization of 64 megabyte DRAMs.

However, the above memory device formed of both cylindrical electrodes and column electrodes which are composed of electrical conductors of different layers, is inconvenient because additional process steps are required due to the different layer compositions. Furthermore, the above cylindrical electrodes are built of duplex spacers on the sidewall of the spacer 30 by anisotropically etching the second polycrystalline silicon layer. In doing so, however, it is uncertain whether the etching of the polycrystalline silicon extends equally over the entire wafer. Because the height of the cylindrical electrode 32 of the central region and that of the edge of the wafer do not coincide, cell capacitance, even on the same wafer, may vary. Additionally, when the object matter to be etched is a polycrystalline silicon, the storage electrodes in the wafer's central region are etched at a different rate than those at the edges, decreasing the memory cell capacitance. As an example of this, FIG. 1G shows a cross-sectional view of an overreached cylindrical electrode which exhibits a memory cell with less-than-expected cell capacitance.

Furthermore, the cylindrical electrode 32 is created by adding another spacer onto the sidewall of the spacer 30 when the top of the cylindrical electrode is anisotropically etched, resulting in the inner edge becoming pointed, and causing the portion of the dielectric layer on top to easily break down. Accordingly, the yield, reliability, and electrical properties of the elements of the memory cell capacitor are undesirable using the previously known techniques of semiconductor manufacturing.

The object of present invention is to provide a high density semiconductor memory device having a storage electrode structure which sufficiently satisfies the cell capacitance requirement for a 64 megabyte DRAM, and higher capacity DRAMs by solving the various problems involved in the above described conventional technology as known heretofore.

SUMMARY OF THE INVENTION

It is an another object of the present invention to provide a proper manufacturing method to manufacture the above high density semiconductor memory device.

The above objects of the present invention are achieved in a high density semiconductor memory device that comprises a plurality of memory cells having one transistor and one capacitor on a semiconductor substrate in the matrix form, whereby the above capacitor is in contact with the above transistor's source region. This is accomplished with a storage electrode having a column electrode comprising a plurality of columns, an outer peripheral electrode completely enclosing the column electrode, a base plate electrode connecting both the cylindrical electrode and the column electrode, a dielectric layer coated over the whole surface of the above electrode, and a plate electrode to be formed on the above dielectric layer.

Another aspect of the present invention is to provide a manufacturing method for a capacitor of a high density semiconductor memory device having a plurality of memory cells in a matrix form each having one transistor and one capacitor on a semiconductor substrate, characterized by comprising the steps of:

depositing a first conductive layer on the substrate on which the above transistors are formed;

coating a first material onto the first conductive layer;

patterning the first material into desired patterns;

forming a second material onto the first conductive layer on which the pattern is formed;

forming a third material onto the second material etching the third material to leave a spacer;

etching the second material using the spacer as a mask;

etching the first conductive layer to a predetermined depth using both the first material and the second material left beneath the spacer as masks;

defining the storage electrode as a cell unit by partially removing the first conductive layer through the use of photolithography techniques;

completing the storage electrode by removing the materials left on the storage electrode;

forming a dielectric layer on the completed storage electrode; and forming a plate electrode by depositing the second conductive layer on the substrate on which the storage electrode is formed.

Another embodiment to achieve the above-mentioned objects of the present invention, whereby a step for separating the storage electrode of each cell by unit differs from the above embodiment, includes the steps of:

depositing a fourth material, the substrate on which the first conductive layer is etched away to a predetermined depth;

defining the fourth material in a unit of each cell by etching portions of the fourth material away;

defining the storage electrode in a unit of each cell by etching the first conductive layer using the remaining fourth material as mask;

filling in a fifth material in the space from which the first conductive layer is partially removed by etching;

removing materials remaining on the storage electrode using the fifth material as protective layers; and completing the storage electrode pattern by subsequently removing the fifth material.

Still another aspect of the present invention is to utilize lower parts of the storage electrode completed according to the aforementioned embodiment, as effective capacitor regions, by sequentially stacking planarization layers, etch-blocking layers, insulating layers and first conductive layers onto a substrate on which the above transistors have been formed. Additionally, steps for removing the insulation layers by wet etching are provided.

BRIEF DESCRIPTION OF THE DRAWINGS

In the detailed description of a preferred embodiment of the invention presented, reference is made to the accompanying drawings in which.

DETAILED DESCRIPTION OF THE INVENTION

Figure 1A:
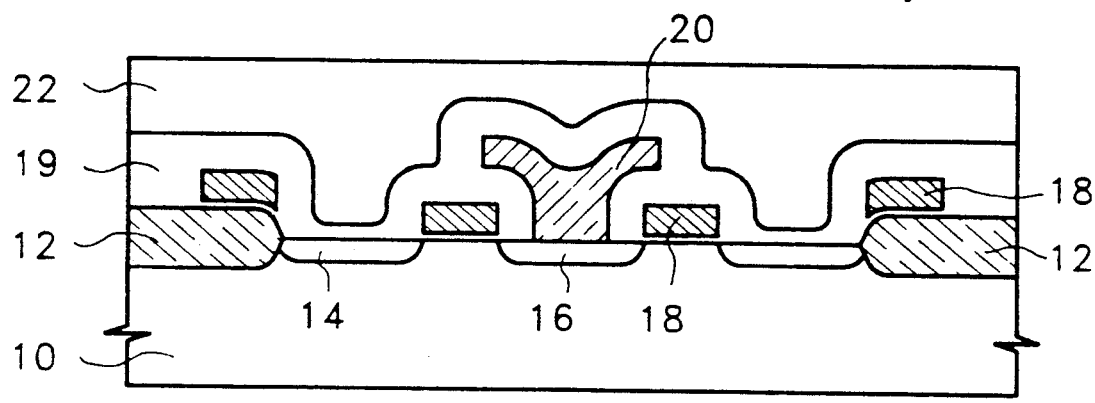
FIGS. 1A through 1G are sectional views illustrating the manufacturing procedure of a conventional high-density semiconductor memory device.
Figure 1B:
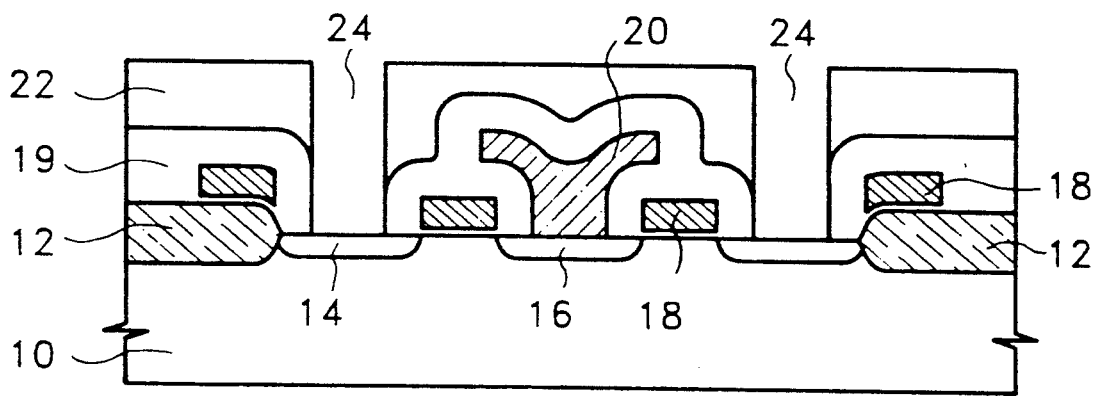
Figure 1C:
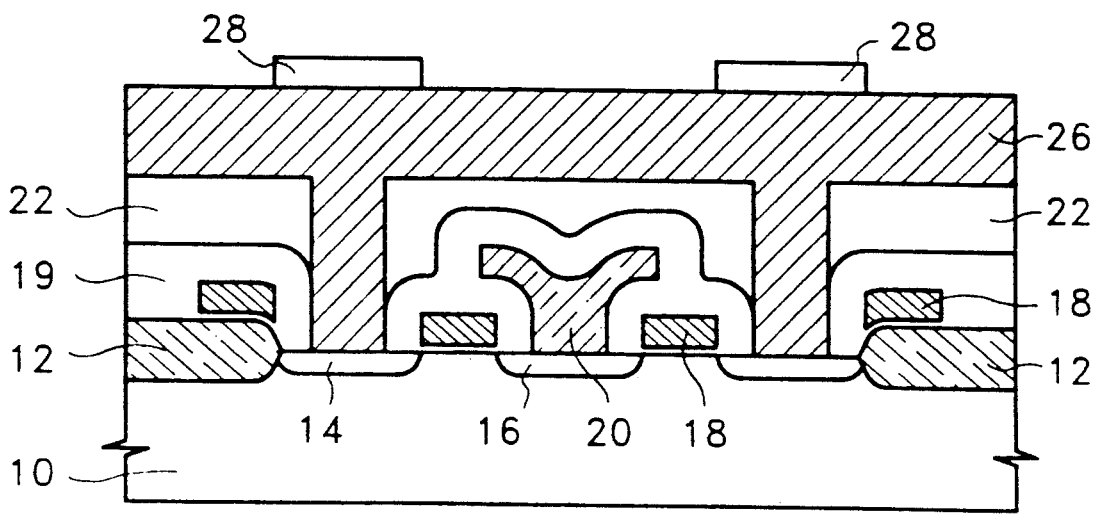
Figure 1D:
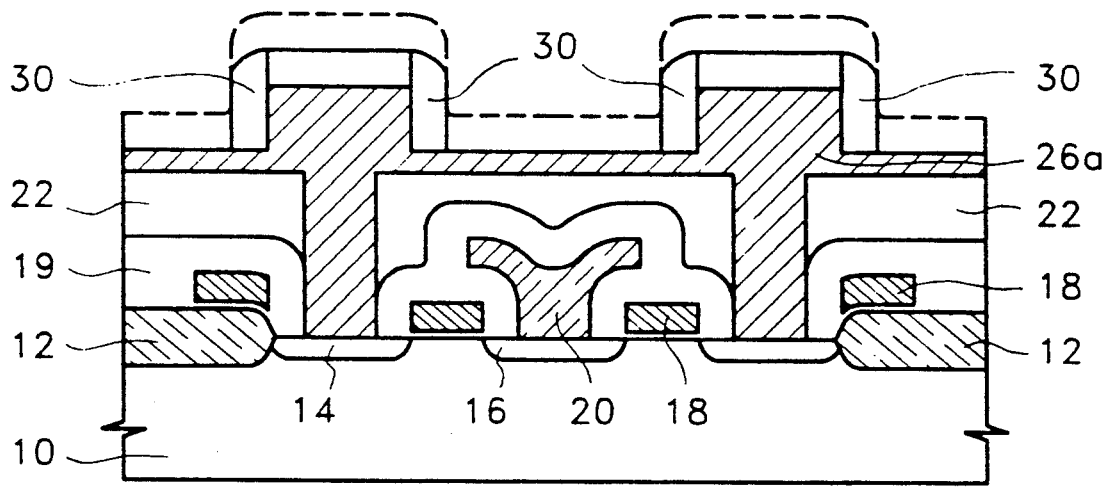
Figure 1E:
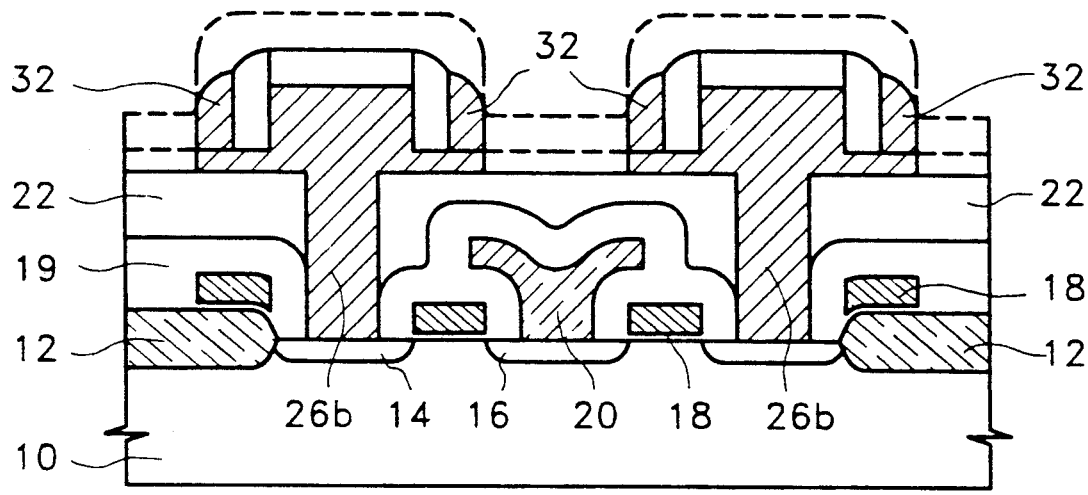
Figure 1F:
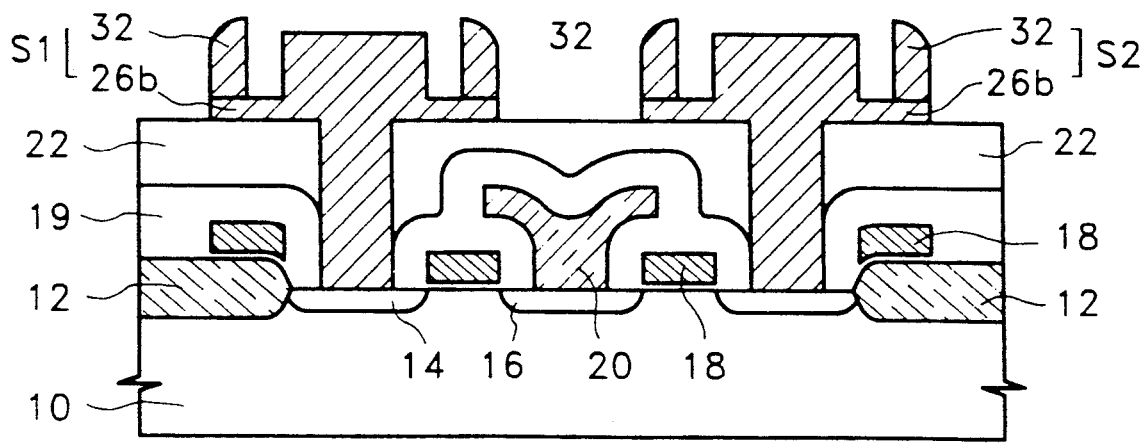
Figure 1G:
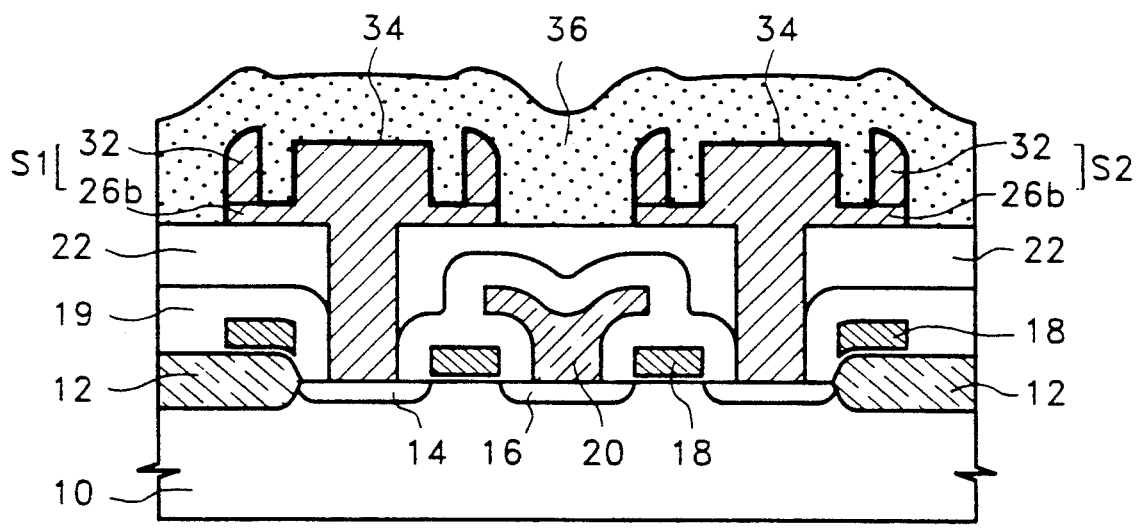
Figure 1H:
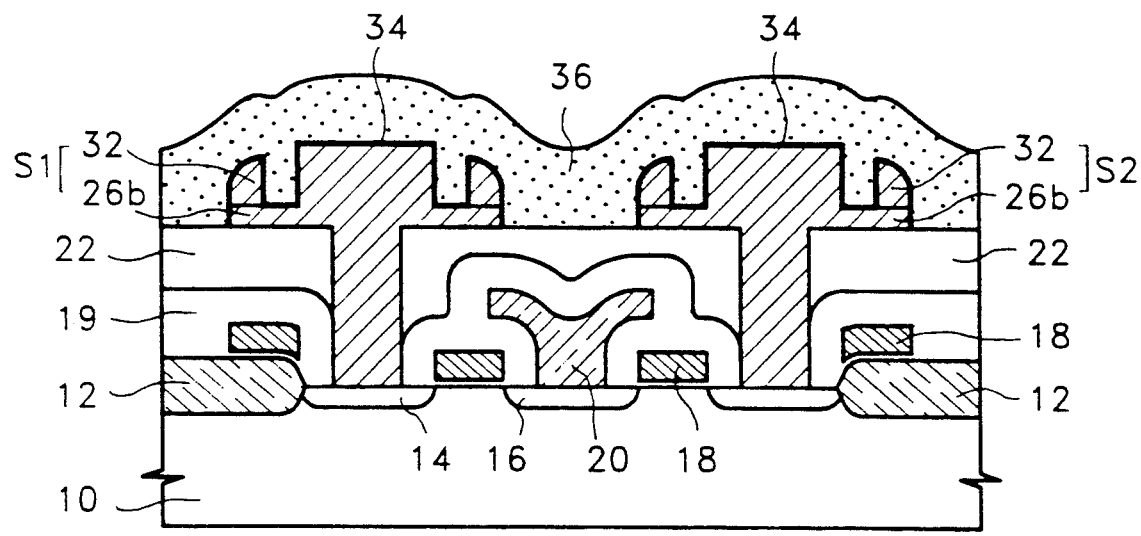
FIG. 1H is a sectional view illustrating the effects of uneven etching throughout the wafer during the manufacturing procedure as shown in FIGS. 1A through 1G.

These and other objects and advantages of the present invention will become more readily apparent from the following detailed description when read in conjunction with the accompanying drawings, throughout which like reference numerals designate like elements and parts.

Figure 2:
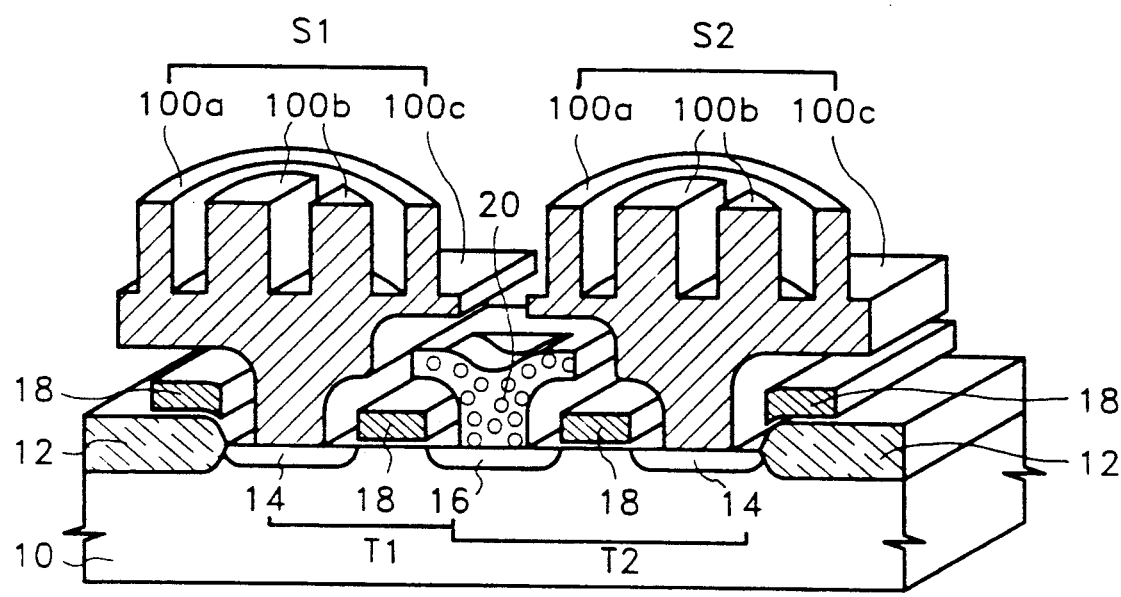
FIG. 2 is a perspective view of a high-density semiconductor device according to the present invention.

In FIG. 2, a pair of transistors T1 and T2 are formed inside a region defined by field oxide layer 12 on a substrate 10. Both transistors occupy a drain region 16 jointly and are provided with respective source regions 14 and gate electrodes 18. Here, the gate electrodes are extended in columns to serve as word lines, and a bit line 20 is connected to the drain region 16. Also, storage electrodes S1 and S2 are respectively connected to each source region 14 of the transistors T1 and T2.

Each storage electrode consists of a cylindrical electrode 100a and a column electrode 100b, and a base electrode plate 100c which is isolated from memory cell regions, connected to the source regions 14, and laterally extending over both the field oxide layer 12 on one side and the bit line 20 on the other. The cylindrical electrode 100a is connected vertically along its lower edge and at right angles to the base electrode 100c, and is hollow, creating an enclosing wall of predetermined thickness.

In addition, the column electrode 100b is also connected vertically to the base electrode but inside cylindrical electrode 100a, and consists of a plurality of vertical bars.

Accordingly, the storage electrodes S1 and S2 are able to expand their effective surface area for accumulating electric charge in a limited memory cell area by using the outer and inner surfaces of cylindrical electrode 100a, the outer surfaces of column electrode 100b and also the outer surface of the base plate electrode 100c. Desired cell capacitance is obtained by controlling the heights of both the cylindrical electrode and the column electrode, and the number of column electrode bars.

Figure 3:
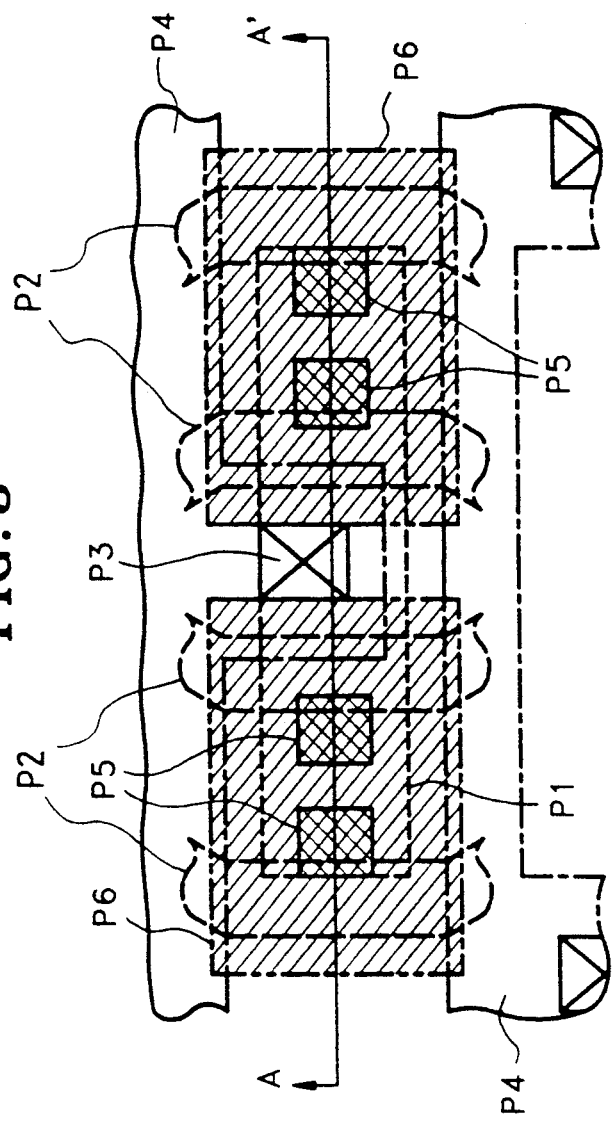
FIG. 3 illustrates a layout of a high-density semiconductor memory device according to the present invention.

FIG. 3 illustrates a layout of a high-density semiconductor memory device according to the present invention. The region defined by short dashed lines and running transversely is a mask pattern P1, used to limit the active region. The symmetrical portions defined by long dashed lines are the mask pattern P2, used to form word lines. The region defined by solid lines, inside of which two diagonally crossing lines are drawn, is the mask pattern P3 for forming contact holes. The regions defined by single-dashed lines, one with a protruding central portion to include the mask pattern P3, are the mask patterns P4, used to form the bit lines. The two pairs of regions defined by solid lines, inside which are drawn oblique lines, are the mask patterns P5 used to form the column electrode portion of the storage electrodes. Finally, the regions defined by double-dashed lines inside of which are drawn oblique lines slanting in the opposite direction to the mask patterns P5, are the mask patterns P6 for limiting the storage electrodes.

Referring now to FIGS. 4A through 4G, which illustrate the manufacturing process steps according to a vertical cross-sectional structure cut along line A—A' of FIG. 3, a manufacturing process embodiment for a high-density memory device according to the present invention will now be described in greater detail.

Figure 4A:
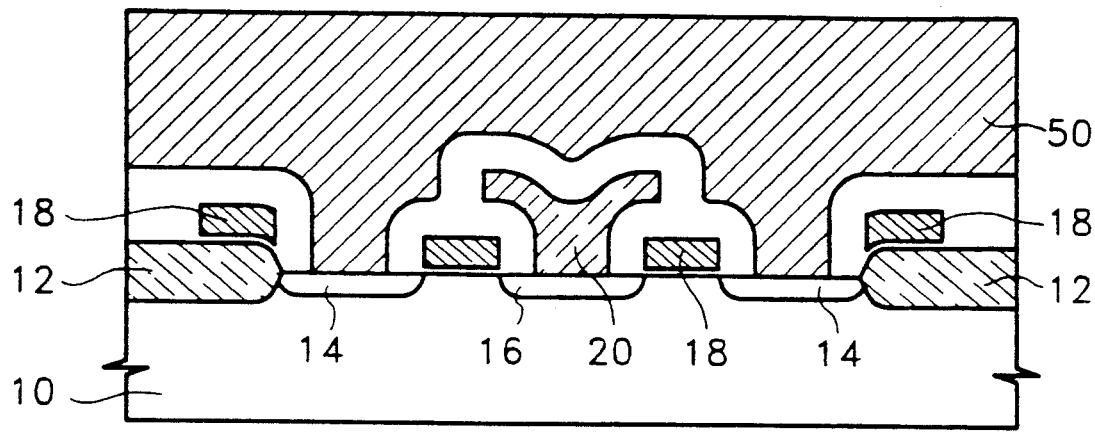
FIGS. 4A through 4G are sectional views illustrating one embodiment of a manufacturing method of a high-density memory device according to the present invention (cut along line A—A' shown in FIG. 3)

FIG. 4A illustrates a step for depositing a first conductive layer 50 following the formation of transistors and bit line 20 on the substrate 10. Prior to the step of depositing the first conductive layer 50, the field oxide layer 12 is formed to define the region wherein elements are to be formed by applying the mask pattern P1 to the substrate 10. The source regions 14, the drain region 16 and the gate electrodes 18 interposing the gate oxide layer in the active region of the substrate defined by the field oxide layer 12 are then formed.

Next, an insulating layer coating the whole surface of the substrate is applied. Contact holes are then formed to electrically connect both the storage electrodes and the bit line 20, which are to be formed to the source regions 14 and drain region 16, respectively. Bit line 20 is formed by depositing conductive material on drain region 16, with the first conductive layer being deposited to a predetermined thickness over the whole surface of the resultant structure so as to form the storage electrodes.

Here, the first conductive layer 50 is preferably formed from polycrystalline silicon, but not so limied, in which impurities have been doped. During this step, the first conductive layer 50 is equal to the final height of the storage electrode, as determined from calculating a desired cell capacitance.

In the above embodiment of the present invention, this thickness may be about 5,000 A.

Figure 4B:
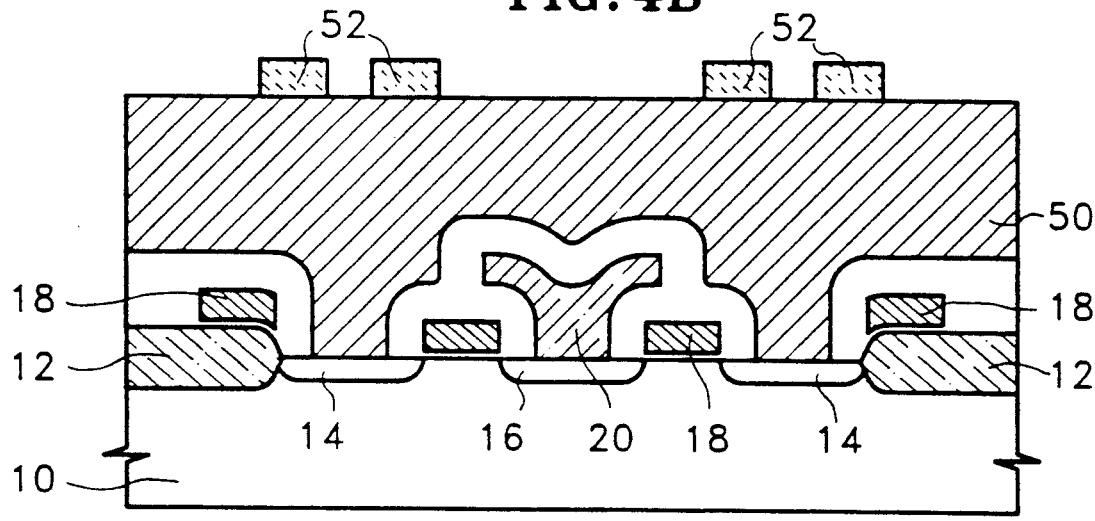

FIG. 4B illustrates the step for patterning a first material 52 after being deposited on the first conductive layer 50. The first material 52, may be $SiO_2$, which has an etch rate different from that of the first conductive layer. Because the pattern of the first material is used in determining both the number and shape of the bars which compose the column electrode portions of the storage electrodes, it is an important element in determining cell capacitance. As a general rule, the more bars that are formed by the pattern, the more the cell capacitance increases.

Figure 4C:
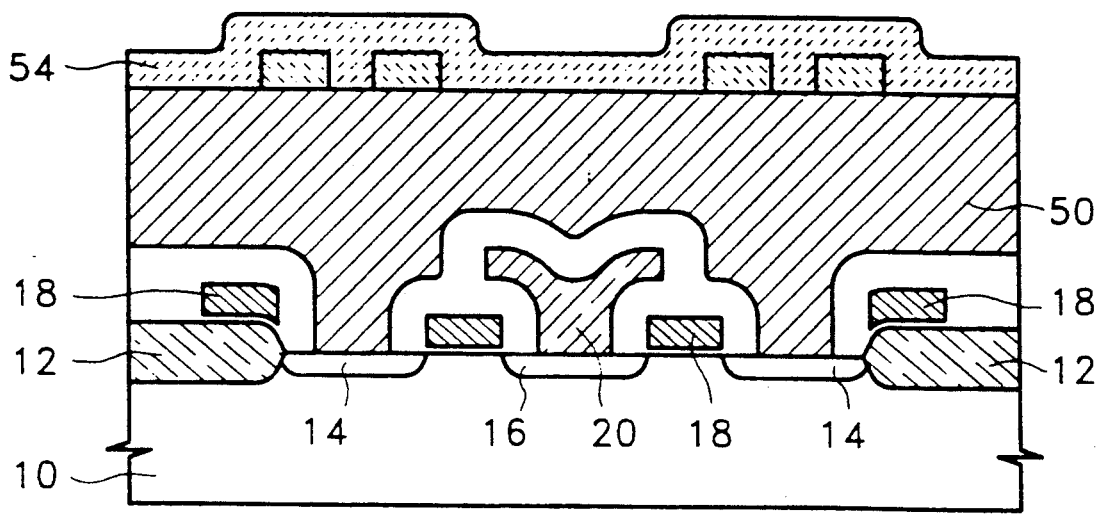

FIG. 4C illustrates the step of applying a second material 54, such as polycrystalline silicon, to cover the whole surface of the substrate on which the first material 52 has been formed. The etch rate of the second material is different from that of the first material. Here, the thickness of the second material becomes an important factor to determine the gap between the column and cylindrical electrode portions of the storage electrode. When an impurity-doped polycrystalline silicon is used as the second material, the height of the cylindrical electrode portion of the storage electrode includes the thickness of the second material, significantly increasing the cell capacitance. The type of impurities used here will usually be of the same type as that found in the source region to which the storage electrode is connected.

Figure 4D:
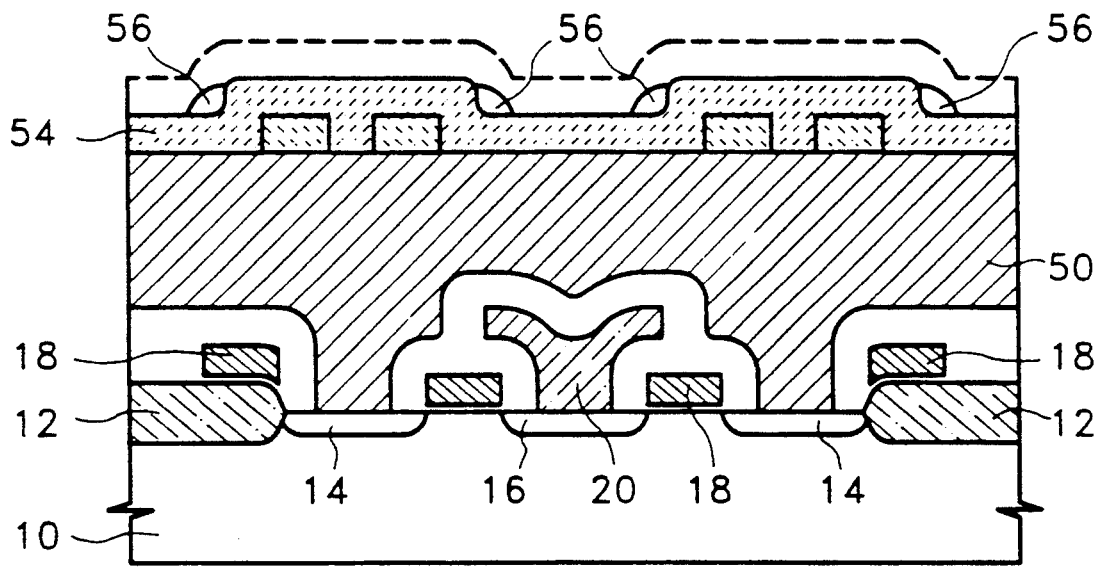

FIG. 4D illustrates the step of forming the spacer 56 by anisotropic etching following the deposit of a third material over the whole surface of the second material 54. The third material has an etch rate different from that of the second material and may comprise, for example, $SiO_2$. The thickness of the spacer 56 is equal to the thickness of the cylindrical electrode portion of the storage electrode and is varied to control cell capacitance. Advantageously, the thinner the aforementioned thickness is, the more the cell capacitance increases.

Figure 4E:
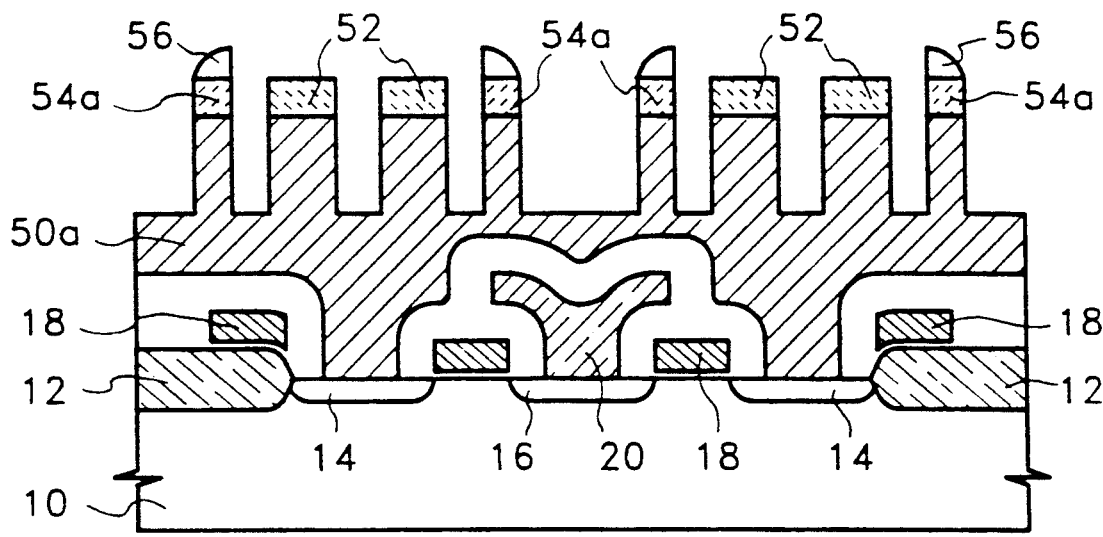

FIG. 4E illustrates the step of forming both the cylindrical and column electrode portions of the storage electrode by etching the first conductive layer 50 using the first, second and third materials as a mask. After partial removal of the second material by etching using only the spacer 56 as a mask, formation of both the cylindrical electrode and the column electrode is completed by etching the first conductive layer to a predetermined depth using the first material, the self-aligned second material 54a, and the spacer 56 as masks. Here, the cell capacitance can be controlled by changing the etching depth of the first conductive layer 50a.

Figure 4F:
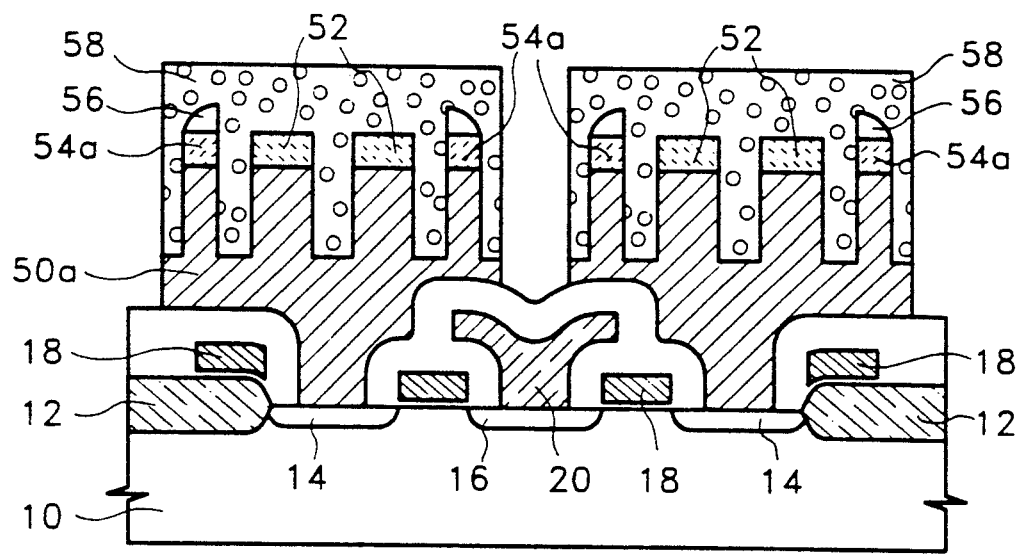

Referring to FIG. 4F, the step of forming the storage electrode pattern 50a, which defines both the cylindrical electrode and column electrodes for each memory cell, is shown. After depositing a photoresist over the whole surface of elements thus far formed and etching the first conductive layer 50a using the mask pattern P6, the storage electrodes 50b (shown in FIG. 4G) are completed to include a cylindrical electrode, a column electrode and a base plate electrode.

Figure 4G:
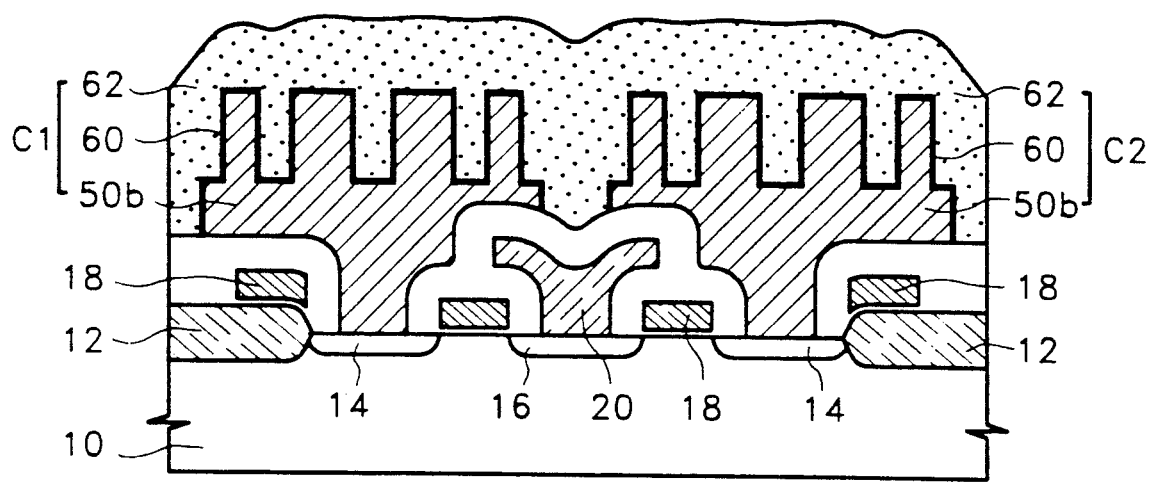

FIG. 4G illustrates the step of forming both a dielectric layer 60 and a plate electrode 62 over the storage electrode. The whole surface of the storage electrode 50b is coated with a material having a high dielectric constant, such as $Ta_2O_5$, but not so limited, to form the dielectric layer 60. Thereafter, the plate electrode 62 is formed by depositing a second conductive layer, such as polycrystalline silicon, but not so limited, in which impurities are doped, over the whole surface of the lower element. A capacitor of a high density semiconductor memory device is thus completed to include the dielectric layer 60 and the plate electrode 62 covering the storage electrode 50b.

Figure 5A:
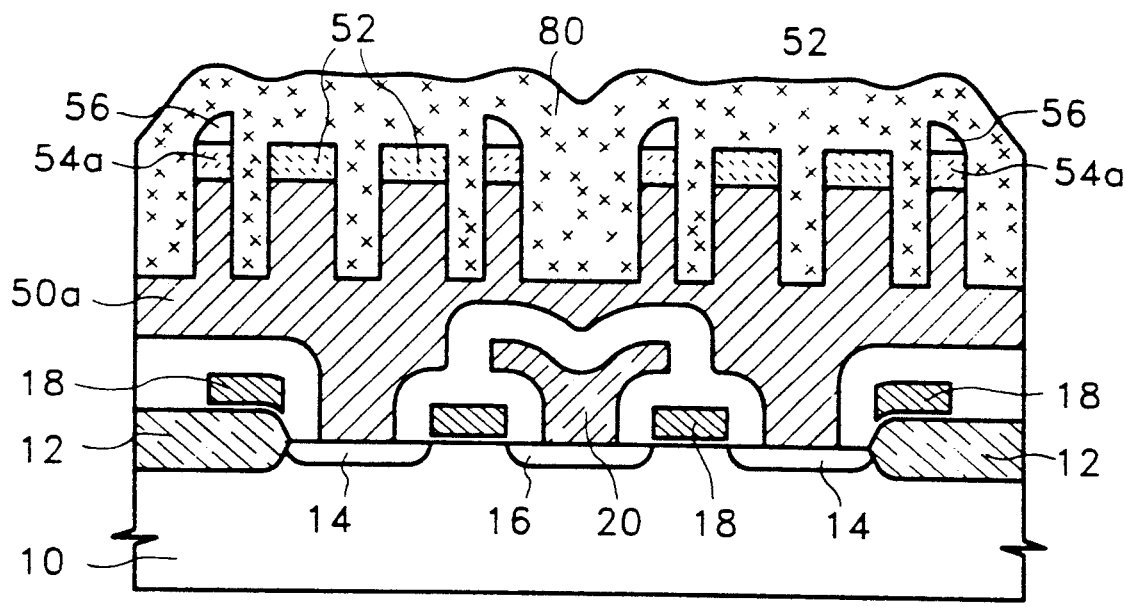
FIGS. 5A through 5E are sectional views of another embodiment of a manufacturing method of the present invention, in which some steps of the embodiment shown in FIGS. 4A through 4G are changed.
Figure 5B:
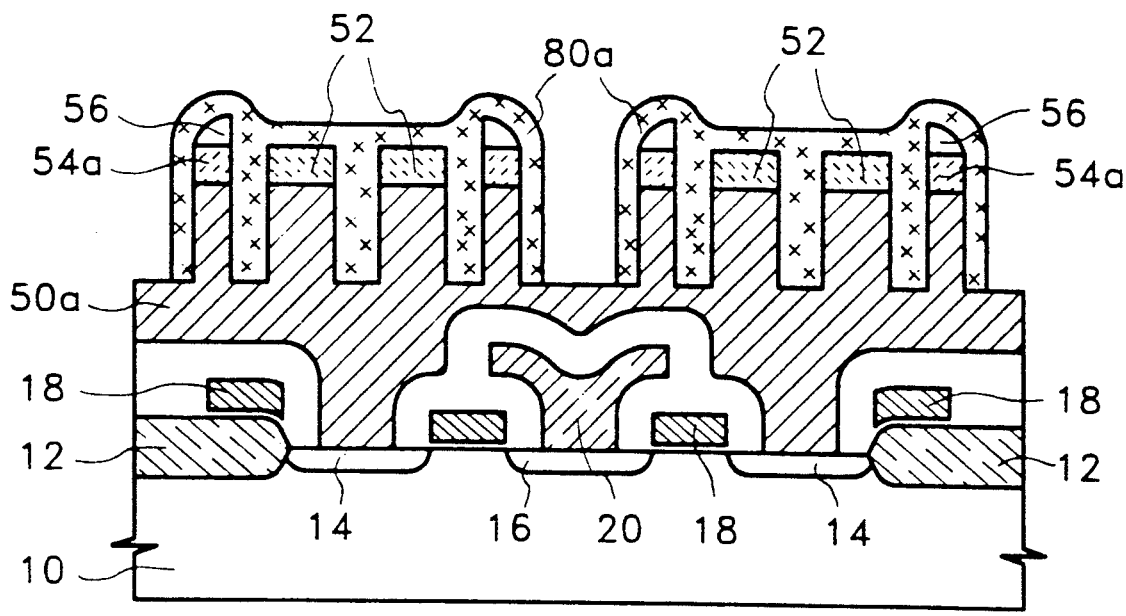

FIGS. 5A through 5E illustrate only the partial steps of another embodiment according to the present invention. After etching the first conductive layer using the first, second and third material as a mask (see to FIG. 4E), a fourth material 80 is deposited over the whole surface of the substrate (as illustrated in FIG. 5A). Referring to FIG. 5b, the fourth material is then separated into memory cell units by anisotropic etching. The fourth material 80a has an etch rate different from that of the first conductive layer, and the first, second and third materials, which protects the existing materials during the aforementioned anisotropic etching and forms spacers onto the sidewall of the materials.

A step of partially removing the first conductive layer using the fourth material as an etching mask is then carried out using a combination of anisotropic and isotropic etching, whereby the isotropic etching is usually performed after the anisotropic etching process. This is to improve the electrical property of the memory device by completely removing any material left in the gullies which separate the cells during any etching process. The more dense the memory cells become, the narrower the gap is between memory cells increasing the susceptibility to unwanted material that may be left behind.

Figure 5C:
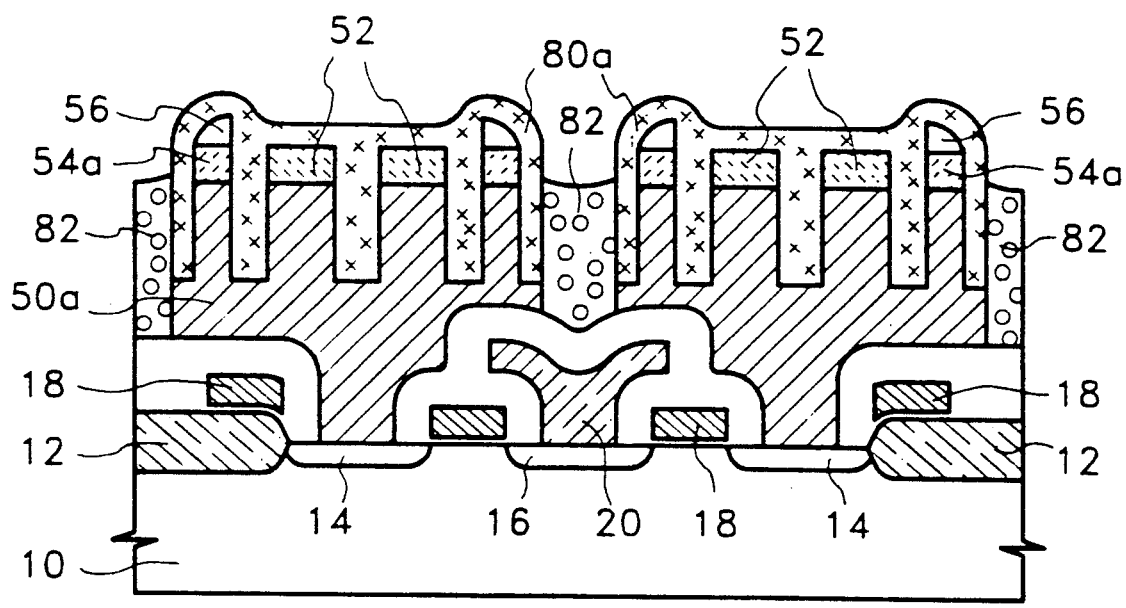

Referring now to FIG. 5C, a fifth material 82 which is a photoresist material, is then filled into the portion where the first conductive layer was partially removed by the aforementioned etching processes using the fourth material as a mask. This prevents damage to the insulating layer above the bit line from occurring during a subsequent process for removing the first, second, third and fourth materials.

Figure 5D:
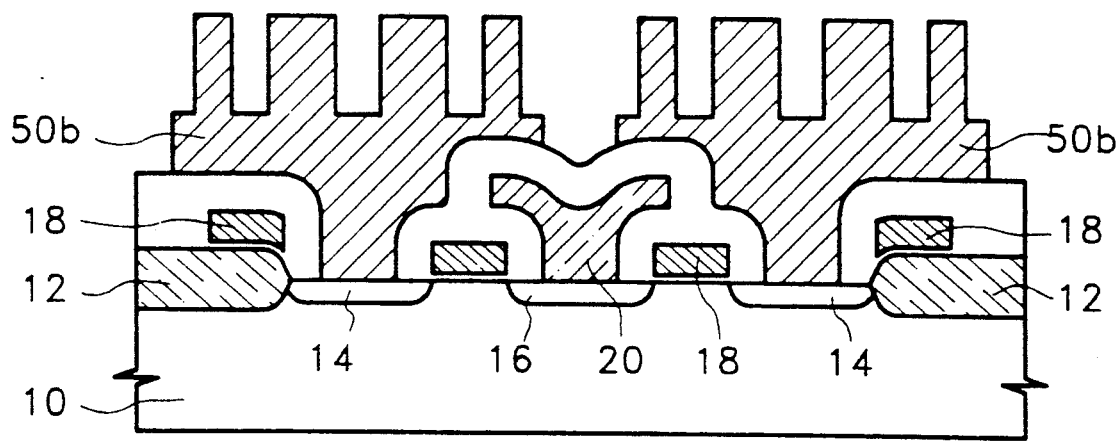
Figure 5E:
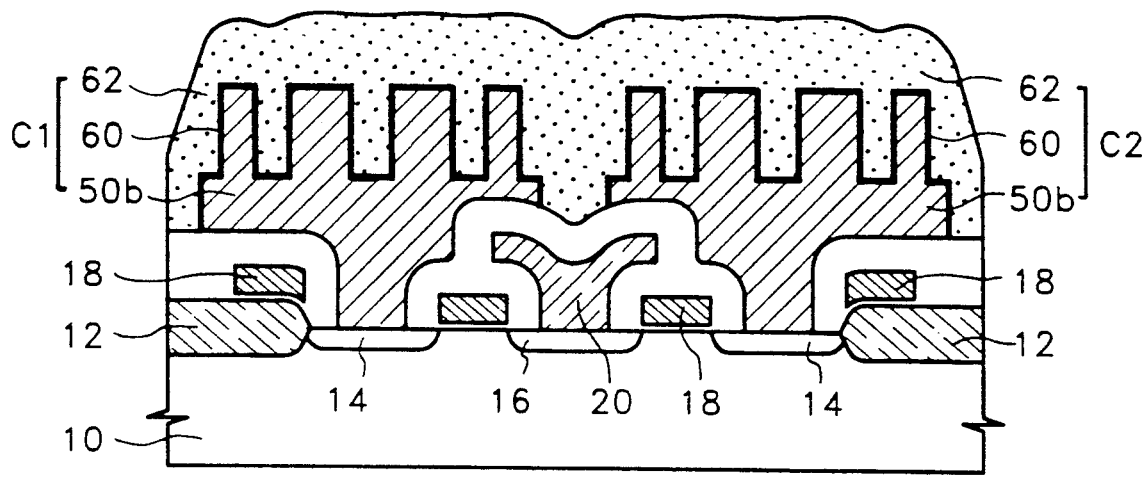

After removal of the first, second, third and fourth materials by wet-etching, which uses the fifth material as a protective wall, the fifth material is removed to complete the structure of the storage electrode 50b (as shown in FIG. 5D). Turning now to FIG. 5E, the capacitors are completed by first coating a dielectric layer 60 over the storage electrode 50b, and then forming a plate electrode 62 over the whole surface of the storage electrode.

The embodiment described above in detail uses the fourth and fifth materials for defining the storage electrode structure into memory cell units, and also prevents a phenomenon whereby parts of the above patterns stick to each other from photoresist that has not thoroughly dried. It should be noted that the smaller the memory cell is, the narrower the gaps between photoresist patterns used for the photo-etching process are, and the more acute this problem may become.

Moreover, the fourth material serves the purpose of defining the storage electrodes in a unit of each cell. The fifth material serves to prevent, when removing the residual material after defining the storage electrodes, damage to the uppermost portion of the substrate that is exposed during the isolation process for the storage electrode.

Figure 6:
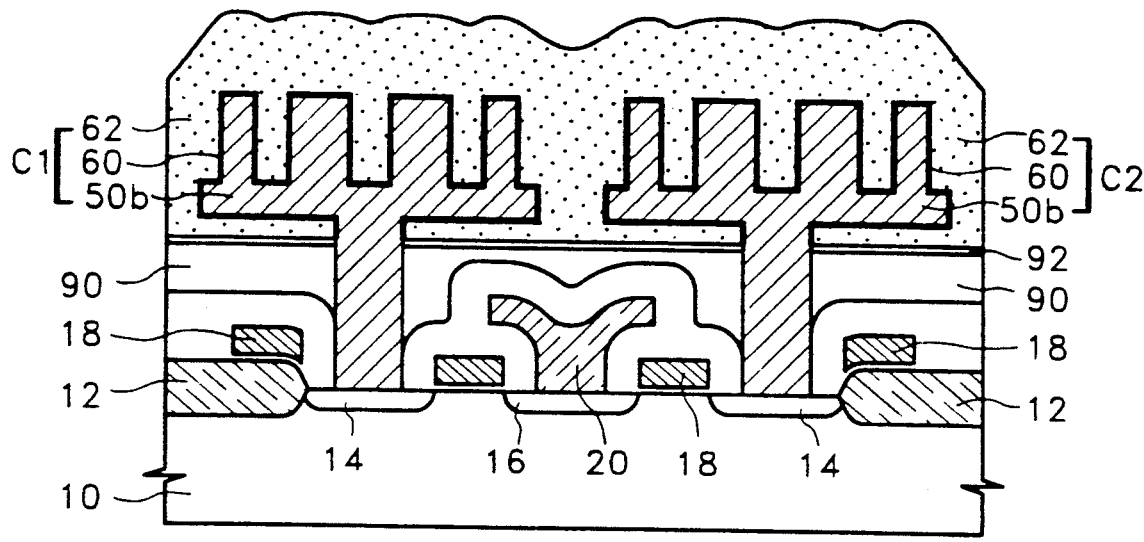
FIG. 6 is a sectional view of still another embodiment of a manufacturing method of the present invention in which some steps of the embodiment shown in FIGS. 4A through 4G are changed.

FIG. 6 is a vertical sectional view of still another embodiment of a manufacturing method for a semiconductor memory device according to the present invention which provides that the lower surfaces of the base plates of the storage electrodes may be used as effective regions for capacitance. In doing so, greater capacitance than that of the aforementioned embodiment may be achieved.

This embodiment provides a planarization layer 90, an etch-blocking layer 92 and a spacer layer on the surface of the substrate on which a transistor has been formed (not shown). The storage electrode pattern may be processed using the same method illustrated in FIG. 4F, with the spacer layer on the etch-blocking layer 92 being subsequently removed.

Figure 7:
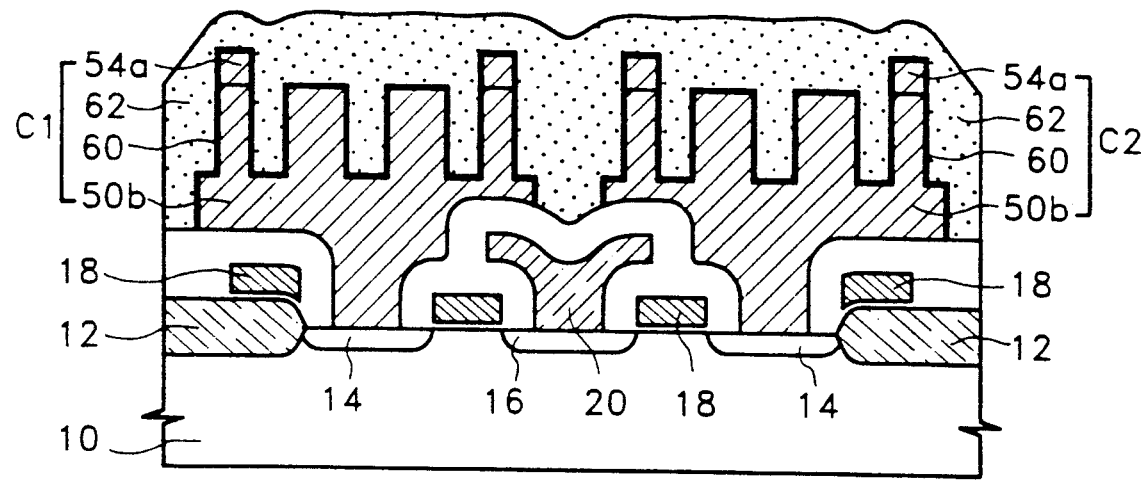
FIG. 7 is a vertical sectional view of yet another embodiment of a manufacturing method of the present invention.

FIG. 7 is a vertical sectional view of yet another embodiment of a manufacturing method according to the present invention which achieves an increase in cell capacitance, such increase corresponding to the thickness of the aforementioned second material. The capacitance achieved is greater than that achieved by employing the above described method in which the storage electrode consists of the first conductive layer only. This is due primarily to the fact that the second material is the same as that of the first conductive layer.

Figure 8:
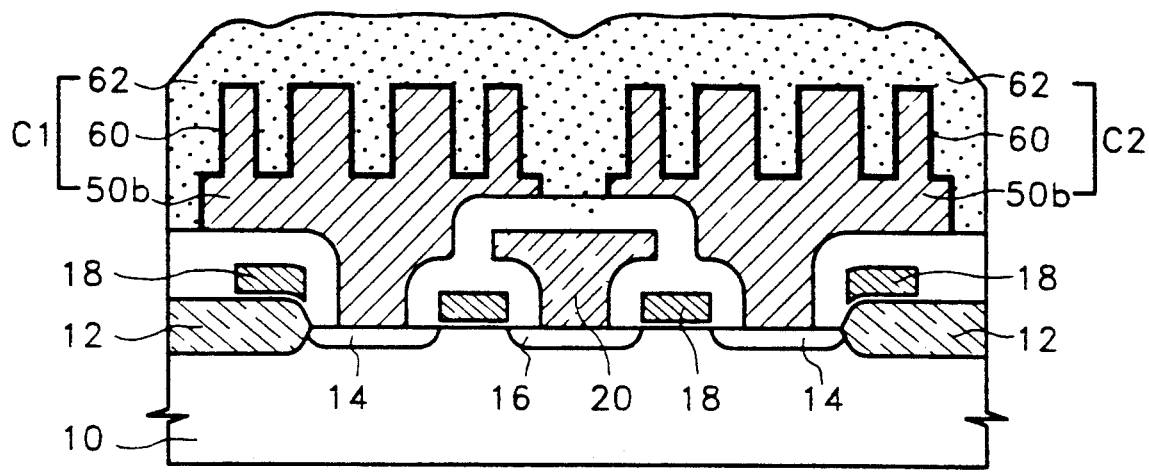
FIG. 8 is a vertical sectional view of still another embodiment of a manufacturing method of the present invention.

FIG. 8 is a vertical sectional view of yet another embodiment of the present invention which improves electrical properties of the device by forming planerized bit lines so that their resistance is reduced.

Figure 9:
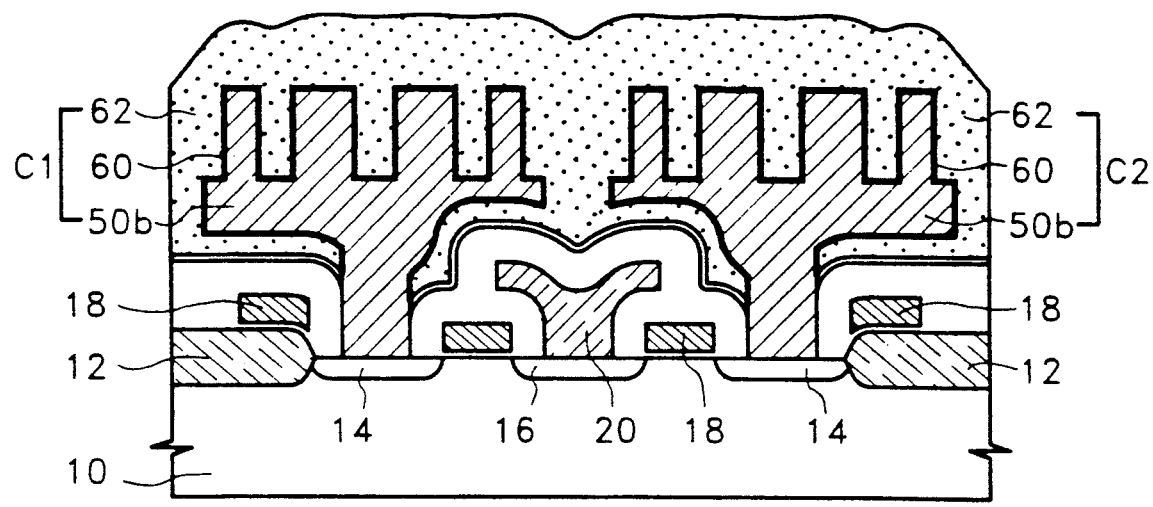
FIG. 9 is a vertical sectional view of a further embodiment of a manufacturing method of the present invention.

FIG. 9 shows a vertical sectional view of a further embodiment of the present invention, characterized in that the base plate of the storage electrode is formed along the various surface bends of the lower structures rather than those planerized surface structures of the embodiment shown in FIG. 6. Having planerized base plate electrodes allows for more effective capacitances to be secured.

Figure 10:
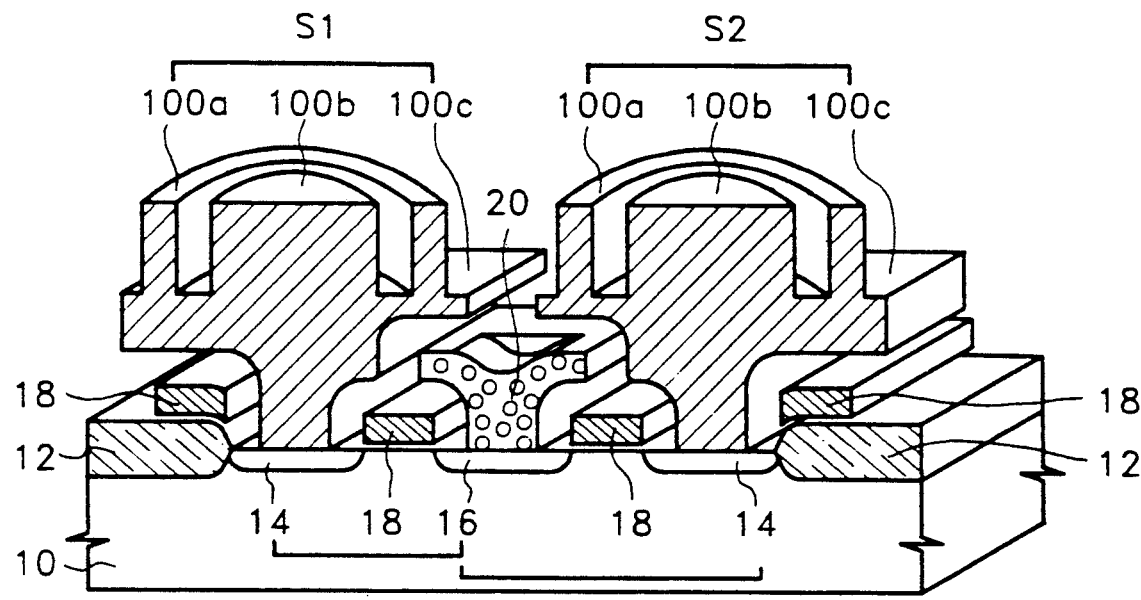
FIG. 10 is a perspective view of still a further embodiment of a high density memory device according to the present invention.
Figure 11:
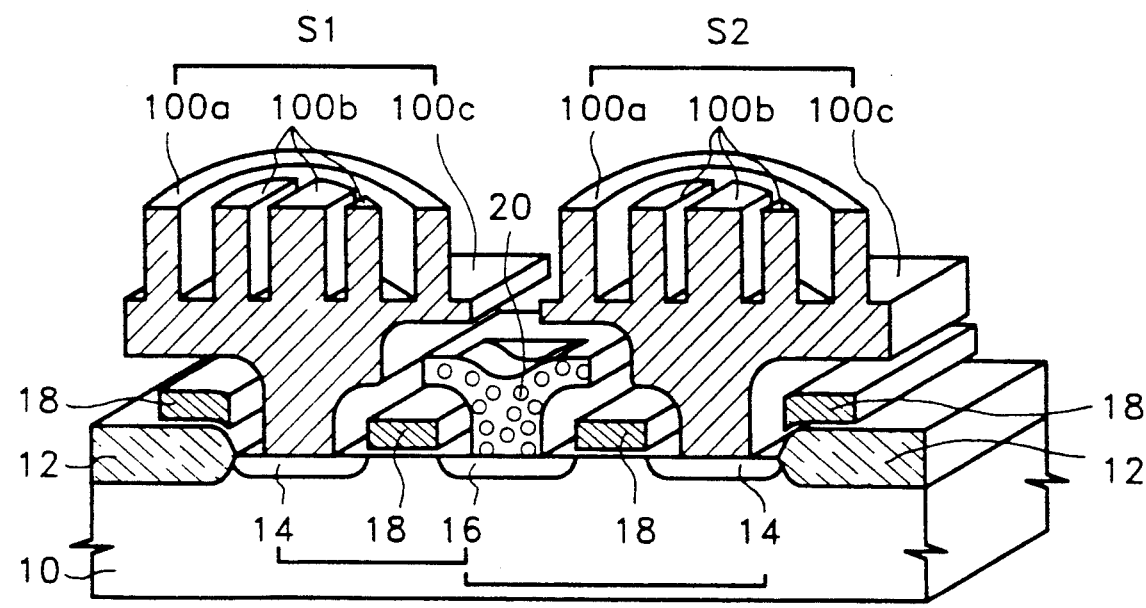
FIG. 11 is a perspective view of a further embodiment of a high density memory device according to the present invention.

FIGS. 10 and 11 are perspective views of other embodiments of the present invention, illustrating storage electrodes in which the column electrode numbers are one or three, respectively. These embodiments teach that the number of the above column electrodes can easily be controlled according to the present invention. Advantageously, the number and shape of the column electrodes may vary according to the patterning method of the first material.

As stated above, the embodiments of a high density semiconductor memory device according to the present invention are able to overcome the problem exhibited in conventional semiconductor devices in which the spacer itself is made from storage electrode material with the sharp-edged tip creating a current leakage problem. Current leakage is eliminated according to the present invention by utilizing storage electrodes that are formed by forming a plurality of column electrode patterns on a conductive layer, forming a spacer surrounding the patterns, and subsequently etching the conductive layer away using both the pattern and the spacer as a mask.

Furthermore, nonuniformity of cell capacitance across a single wafer due to nonuniformity in etching is reduced and the cumbersome steps arising from the need to connect layers to each other are avoided, since storage electrodes are formed from one conductive layer. Moreover, cell capacitance can be increased by selecting various column electrode patterns so as to choose any number of column electrodes. As shown by the unique features of the present invention, MBC cell (Multi-Bar-Cylinder stacked capacitor cell) capacitance is sufficient to provide the capacitance levels required by 64 Mb or higher DRAM cells.

Although the present invention has been illustrated and described herein with reference to specific embodiments, it will be understood by those skilled in the art that without departing from the true scope of the invention as defined in the appended claims, various changes and modifications may be made to, and equivalents may be substituted for, elements thereof. Such changes are deemed to come within the purview of the invention as claimed.

What is claimed is:

1. A high-density semiconductor memory device having a plurality of memory cells each comprising one transistor having a source region and a drain region, and one capacitor in matrix form on a semiconductor substrate, in which said capacitor further comprises:
   a storage electrode disposed adjacent to the source region of said transistor having a column electrode comprising a plurality of bars, an outer peripheral electrode completely enclosing said column electrode, and a base plate electrode having a lower surface, connected to said column electrode and said outer peripheral electrode;
   a dielectric layer coating an entire surface of said storage electrode; and
   a plate electrode formed on said dielectric layer.

2. A high density semiconductor memory device according to claim 1, wherein said outer peripheral electrode comprises a hollow cylinder.

3. A high-density semiconductor memory device according to claim 1, wherein said storage electrode comprises at least one conductive layer.

4. A high-density semiconductor memory device according to claim 1, wherein the lower surface of said base plate electrode is flat.

5. A high-density semiconductor memory device according to claim 1, wherein said base plate electrode is formed along the contours of said transistor structure.

6. A high-density semiconductor memory device according to claim 1, wherein said capacitor utilizes said lower surface of said base plate electrode as an effective capacitance region.

7. A high-density semiconductor memory device according to claim 1, further comprising bit lines which are disposed below said capacitor.

8. A high-density semiconductor memory device as claimed in claim 7, wherein said bit lines are planerized.

9. A high-density semiconductor memory device according to claim 7, wherein said bit lines of said memory device are formed after the formation of said capacitor.

10. A high-density semiconductor memory device having a plurality of memory cells each comprising one transistor having a source region and a drain region, and one capacitor in matrix form on a semiconductor substrate, in which said capacitor further comprises:
   a storage electrode disposed adjacent to the source region of said transistor having a column electrode comprising a plurality of bars of different shapes and sizes, an outer peripheral electrode completely enclosing said column electrode, and a base plate electrode having a lower surface, connected to said column electrode and said outer peripheral electrode;
   a dielectric layer coating an entire surface of said storage electrode; and
   a plate electrode formed on said dielectric layer.

* * * * *